United States Patent [19]

Alexander et al.

[11] Patent Number: 5,061,824

[45] Date of Patent: Oct. 29, 1991

[54] BACKPANEL HAVING MULTIPLE LOGIC FAMILY SIGNAL LAYERS

[75] Inventors: Arthur R. Alexander, Valley Center; Paul M. Rostek, San Diego, both of Calif.

[73] Assignee: NCR Corporation, Dayton, Ohio

[21] Appl. No.: 397,706

[22] Filed: Aug. 23, 1989

[51] Int. Cl.$^5$ .............................................. H05K 1/00
[52] U.S. Cl. .................................. 174/250; 174/261; 174/264; 361/414
[58] Field of Search ............... 174/250, 261, 264, 266; 333/1, 238; 361/414

[56] References Cited

U.S. PATENT DOCUMENTS

| | | | |
|---|---|---|---|
| 3,663,866 | 5/1972 | Iosue et al. | 361/414 |
| 3,740,678 | 6/1973 | Hill | 333/238 |
| 3,792,383 | 2/1974 | Knappenberger | 333/205 |
| 3,876,822 | 4/1975 | Davy et al. | 174/266 |
| 3,895,435 | 7/1975 | Turner et al. | 29/625 |
| 4,030,190 | 6/1977 | Varker | 174/264 X |
| 4,281,361 | 7/1981 | Patz et al. | 174/262 X |
| 4,553,111 | 11/1985 | Barrow | 333/238 |
| 4,560,962 | 12/1985 | Barrow | 174/258 X |
| 4,647,878 | 3/1987 | Landis et al. | 333/115 |
| 4,694,123 | 9/1987 | Massey | 174/268 X |
| 4,736,266 | 4/1988 | Tanibe | 361/424 |
| 4,754,371 | 6/1988 | Nitta et al. | 361/411 |
| 4,799,128 | 1/1989 | Chen | 361/414 |
| 4,810,563 | 3/1989 | DeGree et al. | 428/209 |
| 4,821,007 | 4/1989 | Fields et al. | 174/266 X |

FOREIGN PATENT DOCUMENTS 131851 10/1979 Japan .................. 333/238

Primary Examiner—Morris H. Nimmo
Attorney, Agent, or Firm—Wilbert Hawk, Jr.; Stephen F. Jewett; Gregory P. Gadson

[57] ABSTRACT

A printed circuit board backpanel uses stripline construction to allow emitter coupled logic (ECL) signals and transistor-transistor logic (TTL) signals on the same signal layer, while providing electromagnetic interference (EMI) emission control.

8 Claims, 1 Drawing Sheet

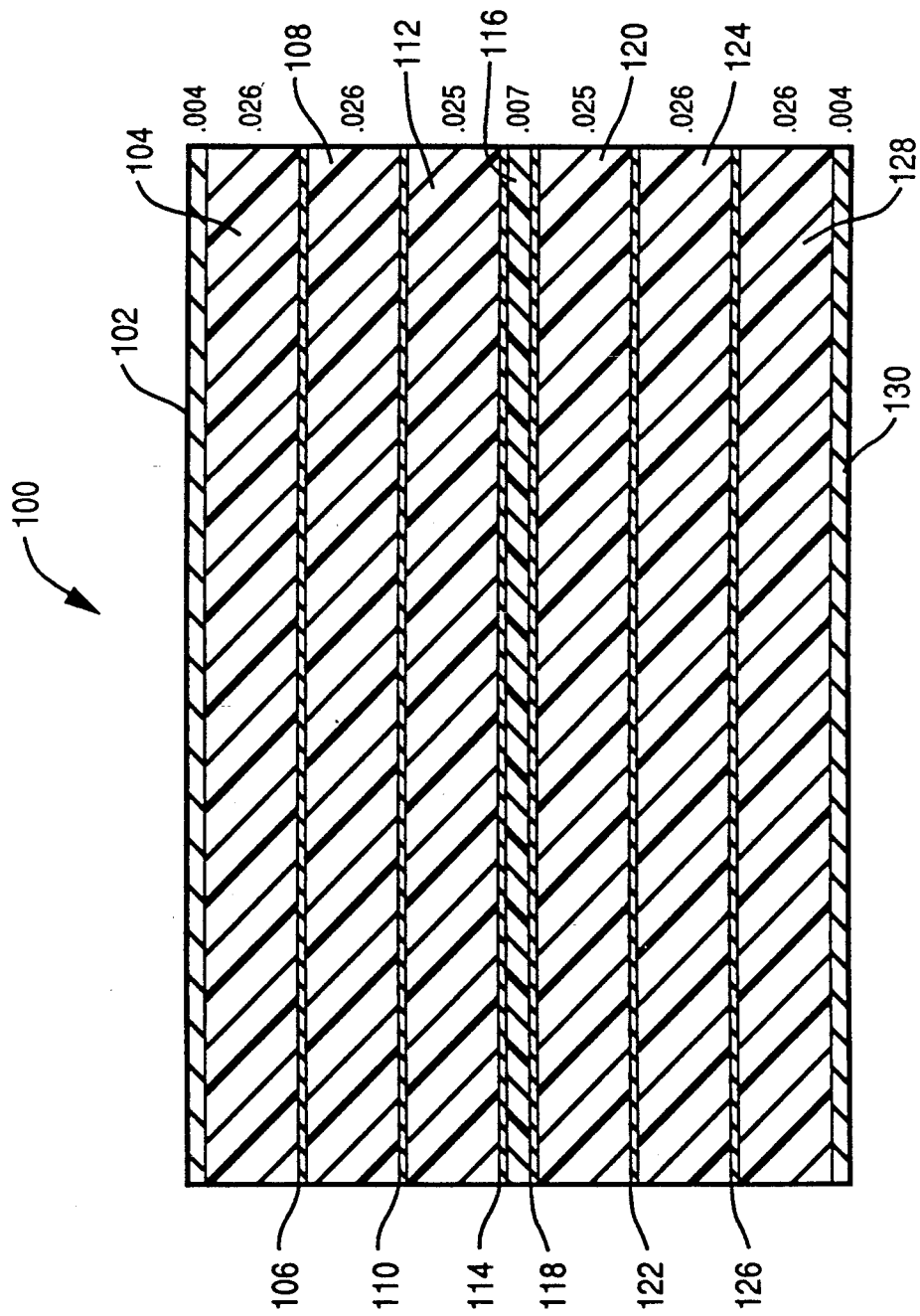

BACKPANEL HAVING MULTIPLE LOGIC FAMILY SIGNAL LAYERS

BACKGROUND OF THE INVENTION

The present invention generally relates to printed circuit boards, and more particularly to backpanels, or those which have system busses embedded therein.

Prior art backpanels often carry busses for more than one logic family, when those logic families are present in the computer system served. For example, a computer system may contain emitter-coupled logic (ECL) circuits and transistor-transistor logic (TTL) circuits which require separate busses. ECL busses require approximately 50 ohms nominal impedance, while TTL busses require approximately 76 ohms nominal impedance. Because of bus size requirements, prior art backpanels, which often use "micro-strip" construction (ground and power layers in between the signal layers), have separate signal layers for each logic family, thus adding volume and expense.

The prior art does not contemplate combining ECL and TTL signals on the same signal layer since, inter alia, the ECL tracings would be too large compared to the TTL tracings (there would not be enough room in a signal layer of a prior art backpanel for both logic families to reside).

SUMMARY OF THE INVENTION

It is an object of the present invention to provide a backpanel wherein signals of more than one logic family are transmitted on the same signal layer.

It is another object of the present invention to implement such a backpanel in a form which has low levels of electromagnetic interference (EMI) emissions.

It is a further object of the present invention to meet the above objects by constructing a backpanel using a strip-line technique (the ground planes as the outer layers).

There is provided in accordance with the present invention, a backpanel which includes at least one signal layer, each signal layer carrying. The present invention uses a form of strip-line construction both to form signal layers with co-resident logic families, and to reduce EMI emissions.

The above and other objects, features, and advantages of the present invention will become apparent from the following description with reference to the attached drawing.

BRIEF DESCRIPTION OF THE DRAWING

The sole drawing figure is a cross-sectional side view of the present inventive backpanel.

DETAILED DESCRIPTION OF THE INVENTION

Referring now to the drawing figure, a dual sided backpanel 100 surrounded by ground layers 102 and 130 has a number of dielectric substrate layers 104, 108, 112, 116, 120, 124 and 128 positioned between several signal layers 106, 114, 118, and 126, and two power layers 110 and 122. The thicknesses (in inches) of the various substrate and ground layers are indicated immediately to the right of the layers in the drawing figure.

The signal and power layers of the backpanel 100 are constructed either by bonding copper (periodic symbol Cu) film to the substrates and etching away appropriate areas to leave the desired patterns, or by depositing the appropriate pattern of copper onto the substrates. In the preferred embodiment all signal layers—including the layer 118, which carries 12 volt power and minus 12 volt power—are constructed of copper material with a distribution of 1 ounce of copper per square foot. The ground layers 102 and 130, as well as the 5 volt power layers 110 and 122 have a distribution of 2 ounces of copper per square foot.

The TTL busses typically have trace widths of 10–11 mil, while the ECL busses typically have trace widths of 25–27 mil. The configuration of the backpanel 100 allows the number of signal layers to be limited to the number necessary to carry the TTL busses, and allows the optimum impedance characteristics for each logic family to obtain high signal integrity and low signal distortion. An added benefit of the configuration, and more particularly the surrounding of the signal layers by the power and ground layers, is a reduction in the amount of EMI emissions from the backpanel 100.

Use of strip-line construction (as opposed to microstrip construction) in the present invention results in a lower effective dielectric value (and lower impedance) for the signal layers, thereby allowing for smaller bus trace widths. Hence both ECL and TTL signals can be transmitted on the same signal layer.

The previous description has been limited to the particulars of the present invention, and has thus not detailed the construction of backpanels. However, general descriptions of backpanels and other multi-layered printed circuit boards are available in prior art literature such as U.S. Pat. Nos. 4,694,123 (granted to Massey) and 4,030,190 (granted to Varker), for example, which patents are hereby expressly incorporated by reference in the present letters patent.

Variations and modifications to the present invention are possible given the above disclosure. However, variations and modifications which are obvious to those skilled in the art are intended to be within the scope of this letters patent.

We claim:

1. A multi-layered backpanel comprising:
   two ground layers serving as the outermost layers of said backpanel;
   a plurality of dielectric layers;
   a plurality of signal layers for carrying signals representing a plurality of logic families, said signal layers comprising two innermost signal layers having a dielectric layer coupled between them and serving as the innermost layers of said backpanel, and comprising additional signal layers; and
   a plurality of power layers for carrying supply power;
   wherein each innermost signal layer is also coupled via a dielectric layer to a power layer, and remaining layers of said backpanel alternate between signal layers and power layers with dielectric layers is coupled in between, and a dielectric layer is coupled to each said ground layer and a remaining layer.

2. The backpanel in claim 1 wherein the number of said logic families is two.

3. The backpanel in claim 1 wherein the dielectric layers coupled to said ground layers are also coupled to signal layers.

4. The backpanel in claim 3 wherein the number of signal layers is four, and the number of power layers is two.

5. A multi-layered backpanel comprising:
two ground layers serving as the outermost layers of said backpanel;
a plurality of dielectric layers;
a plurality of signal layers for carrying signals representing a plurality of logic families, said signal layers comprising two innermost signal layers having a dielectric layer coupled between them and serving as the innermost layers of said backpanel, and comprising additional signal layers; and
a plurality of power layers for carrying supply power;
wherein each innermost signal layer is also coupled via a dielectric layer to a first side of a power layer, and the second side of that power layer is coupled via a dielectric layer to an additional signal layer, and remaining layers of said backpanel alternate between power layers and signal layers with dielectric layer is coupled in between, and a dielectric layer is coupled to each said ground layer and a remaining layer.

6. The backpanel in claim 5 wherein the number of said logic families is two.

7. The backpanel in claim 5 wherein the dielectric layers coupled to said ground layers are also coupled to signal layers.

8. The backpanel in claim 7 wherein the number of signal layers is four, and the number of power layers is two.

* * * * *

UNITED STATES PATENT AND TRADEMARK OFFICE
CERTIFICATE OF CORRECTION

PATENT NO. : 5,061,824

DATED : October 29, 1991

INVENTOR(S) : Arthur R. Alexander, et al.

It is certified that error appears in the above-identified patent and that said Letters Patent is hereby corrected as shown below:

Column 2, line 57, delete "is".

Column 4, line 4, delete "layer" and substitute --layers--.

Column 4, line 4, delete "is".

Signed and Sealed this

Twenty-third Day of March, 1993

Attest:

STEPHEN G. KUNIN

Attesting Officer    Acting Commissioner of Patents and Trademarks